(12) United States Patent
Machida

(10) Patent No.: US 7,161,196 B2
(45) Date of Patent: Jan. 9, 2007

(54) PHOTOELECTRIC CONVERTER AND IMAGE SENSOR IC

(75) Inventor: Satoshi Machida, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 10/939,053

(22) Filed: Sep. 10, 2004

(65) Prior Publication Data
US 2005/0067641 A1   Mar. 31, 2005

(51) Int. Cl.
*H01L 27/148* (2006.01)
*H01L 29/768* (2006.01)

(52) U.S. Cl. ............... 257/233; 257/291; 257/292; 257/462

(58) Field of Classification Search ............... 257/233, 257/291, 292, 461, 462
See application file for complete search history.

(56) References Cited

U.S. PATENT DOCUMENTS

| | | | | |
|---|---|---|---|---|
| 6,703,653 B1* | 3/2004 | Kim | ............ | 257/290 |
| 6,882,022 B1* | 4/2005 | Hynecek | ............ | 257/461 |
| 6,960,795 B1* | 11/2005 | Rhodes | ............ | 257/215 |

* cited by examiner

*Primary Examiner*—Fernando L. Toledo
(74) *Attorney, Agent, or Firm*—Adams & Wilks

(57) ABSTRACT

A photoelectric converter has a first semiconductor region having a first conductivity type, a pixel region for accumulating generated carriers, a second semiconductor region having a second conductivity type disposed within the first semiconductor region and inside the pixel region, an electrode region having the second conductivity type disposed on the second semiconductor region, and an oxide film disposed around the electrode region. A first aluminum wiring contacts the electrode region via a contact hole disposed in an intermediate insulating film for transforming a signal according to a quantity of the generated carriers accumulated in the pixel region. A second aluminum wiring encircles an outer periphery of the pixel region and is held at a predetermined constant potential. A transparent conductive film is disposed on the oxide film and inside the second semiconductor region and contacts the second aluminum wiring.

18 Claims, 6 Drawing Sheets

PHOTOELECTRIC CONVERTER AND IMAGE SENSOR IC

BACKGROUND OF THE INVENTION

1. Field of the Invention

The present invention relates to a photoelectric converter for receiving a reflection light from an original to which light is irradiated and then converting into an electric signal, and an image sensor integrated circuit (IC) in which a plurality of the photoelectric converters are arranged in a line or a matrix shape. More particularly, the present invention relates to an improvement of that pixel structure.

2. Description of the Related Art

FIG. 14 shows a plan view of a light receiving element of a photoelectric converter used in a conventional image sensor, and FIG. 15 shows a sectional view of the A–A' of FIG. 14 (refer to JP 2000-311997 A).

In the present invention, in order to protect an image quality from being dropped by low frequency noise, such as power supply noise and the like, which is radiated from outside the photoelectric converter, a conductor 6' serving as a shield is formed on an output wiring 5 of the light receiving element.

However, in the above-mentioned photoelectric converter, an output wiring 5 is an AL wiring. Thus, a conductor thereon needs to be constituted by the AL of a second layer, or another conductive film needs to be additionally formed. Thus, since the formation can not be implemented only by a typical AL one layer process, this results in the problem of an expensive cost. Also, a photo diode diffusion region 2 is smaller than an opening portion 1. Hence, in the diffusion region 2, optical carriers generated in the opening portion 1 can not be sufficiently caught, which results in the problem of a poor sensibility efficiency. So, if the diffusion region 2 is made larger, since any shield layer does not exist on the diffusion region, the external noise brings about the potential variation in the diffusion region, which results in the problem of the drop in an image quality.

SUMMARY OF THE INVENTION

To solve the above-mentioned conventional problems, according to an aspect of the present invention, there is provided a photoelectric converter, including: a first semiconductor region of a first conductive type which is formed within a pixel region; a second semiconductor region of a second conductive type which is formed within the first semiconductor region and in which optically generated carriers can be accumulated; and a conductor which is formed through an insulator on the second semiconductor region and held at a predetermined potential. Further, in the photoelectric converter, the conductor is made of poly-silicon.

According to another aspect of the present invention, there is provided a photoelectric converter, including: a first semiconductor region of a first conductive type which is formed within a pixel region; a second semiconductor region of a second conductive type which is formed within the first semiconductor region and in which optically generated carriers can be accumulated; a wiring for electrically connecting the second semiconductor region and a circuit element configured outside the pixel region; and a conductor which is formed through an insulator on the wiring and held at a predetermined potential. Further, in the photoelectric converter, the wiring is made of poly-silicon.

According to the photoelectric converter, since the portion on the photodiode diffusion region of the light receiving element is shielded by the poly-silicon of a constant potential, the influence of the external noise can be suppressed. Also, since the poly-silicon has a certain degree of transmittivity to visible light, the drop in the sensibility can be reduced. Also, the output wiring of the photodiode is made of the poly-silicon, and the portion thereon is shielded by the AL of the constant potential. Thus, the influence of the external noise can be suppressed.

Since the above-mentioned structure can be constituted by the AL one layer process of a typical CMOS, the cost can be suppressed.

DETAILED DESCRIPTION OF THE PREFERRED EMBODIMENTS

Embodiment

Figure 1:
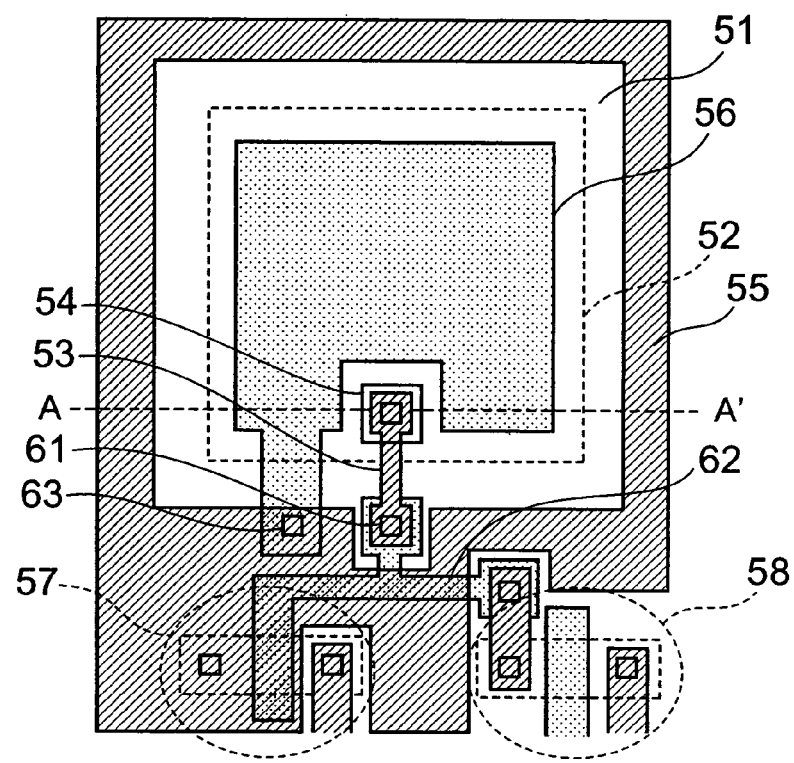
FIG. 1 is a plan view of a light receiving element of a photoelectric converter according to an embodiment of the present invention.
Figure 2:
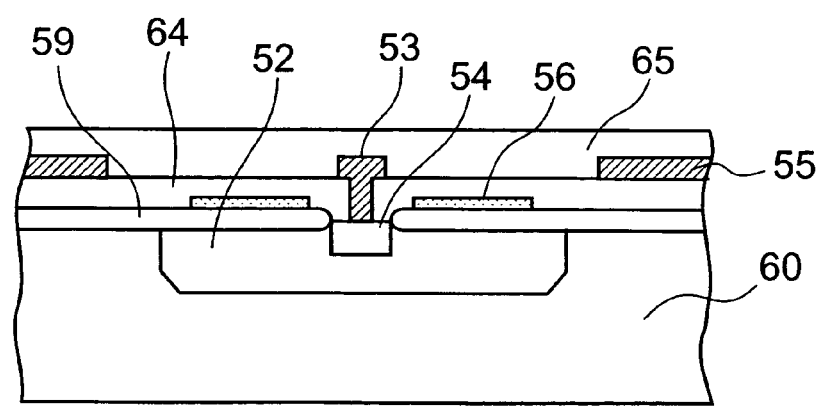
FIG. 2 is a sectional view taken along line A–A' of FIG. 1.

FIG. 2 is a sectional view taken along the line A–A' of FIG. 1.

The light receiving element in the present invention has a P-type semiconductor substrate region 60 as a first conductive type of a first semiconductor region within a pixel region 51; an N-type semiconductor region 52 which is provided in the P-type semiconductor substrate region 60 as a second conductive type of a second semiconductor region in which optically generated carriers are accumulated; and a poly-silicon 56 serving as a conductor which is formed through a LOCOS oxide film 59 serving as an insulator on the N-type semiconductor region 52 and held at a predetermined potential. The poly-silicon 56 is electrically connected to an AL wiring 55 (hereinafter "AL 55"), which also functions as a light shielding device of a VSS potential, through a contact 63. The N-type semiconductor region 52 as a photodiode diffusion region may be constituted by an N-well. The output of the photodiode is inputted through an N+ region 54 constituting an electrode and through an AL wiring (photodiode output terminal) 53 and a poly-silicon wiring 62 to a circuit 58 for resetting the photodiode and to a source follower circuit 57. The circuit 58 is composed of NMOS transistors and the like. The circuit 57 is composed of PMOS transistors and the like.

The output wiring of the photodiode is connected through a contact 61 from the AL to the poly-silicon wiring 62. The AL 55 of the VSS potential exists on the poly-silicon wiring 62.

The semiconductor region 52 of the light receiving element is at the floating state in the case of the accumulation. Thus, when the region receives the radiation noise from outside, its potential is varied.

However, as mentioned above, the conductive film 56 of the constant potential exists on the photodiode semiconductor region 52. Hence, the radiation noise coming from above the photodiode can be shielded. According to FIG. 1, although the conductive film 56 does not perfectly cover on the photodiode diffusion region 52, the shielding effect against the noise can be sufficiently obtained.

Also, when the output wiring of the photodiode receives the radiation noise from the outside, its potential is varied similarly to the diffusion region 52 of the light receiving element. However, as shown in FIG. 1, the AL 55 which is the conductive film of the constant potential exists on the photodiode output wiring 62. Thus, it is possible to shield the radiation noise coming from above the photodiode. Since the conductive film of the constant potential does not exist on the photodiode output terminal 53, the influence of the radiation noise is received. However, this influence can be reduced by making the output terminal 53 as short as possible.

The manufacturing method will be described below with reference to FIG. 2. The N-well serving as the substrate of the PMOS transistor is formed on the P-type substrate, and simultaneously with the formation, the N-type semiconductor region 52 of the photodiode is formed. This diffusion region may be formed apart from the N-well. Next, the LOCOS oxide film 59 is formed. Next, the poly-silicon conductive film 56 and the poly-silicon wiring 62 are formed simultaneously with the gate region of the transistor. Next, an electrode 54 of the photodiode is formed simultaneously with the source drain regions of the NMOS. Next, an intermediate insulation film 64 is formed, and a contact hole is formed. Next, simultaneously with the formation of the AL wiring, the AL 55 is formed. Then, a passivation film 65 is formed.

In the above-mentioned explanation, the P-type substrate may be replaced by the N-type substrate, and the diffusion region 52 and the photodiode electrode 54 may be replaced by the P-type semiconductors.

As mentioned above, according to this embodiment, the light receiving element can be manufactured without adding any step to the typical AL one layer CMOS process.

Furthermore, the conductive film 56 need not be made of poly-silicon, and may be a different type of conductive film which is transparent For example, the conductive film such as ITO and the like may be formed on or under the passivation film 65. Also, the potential of the conductive film 56 may not be VSS, and it may be fixed to the constant potential.

Figure 3:
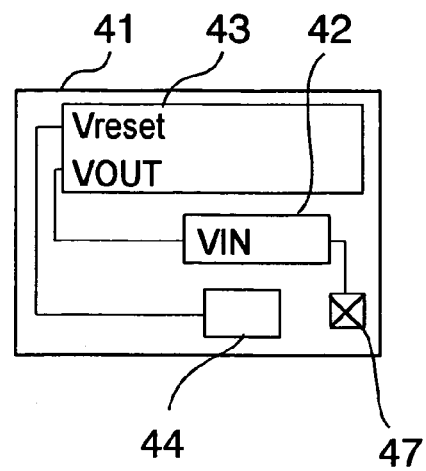
FIG. 3 is a schematic view of an image sensor IC according to the embodiment of the present invention.

FIG. 3 is a schematic view of the image sensor IC in this embodiment. This image sensor IC 41 is provided with a signal processing circuit 42, a photoelectric converter 43, a reference voltage circuit 44 and a signal output terminal 47. The common signal line of the photoelectric converter 43 is inputted to the signal processing circuit 42, and the output of the signal processing circuit 42 is connected to the signal output terminal 47.

Figure 4:
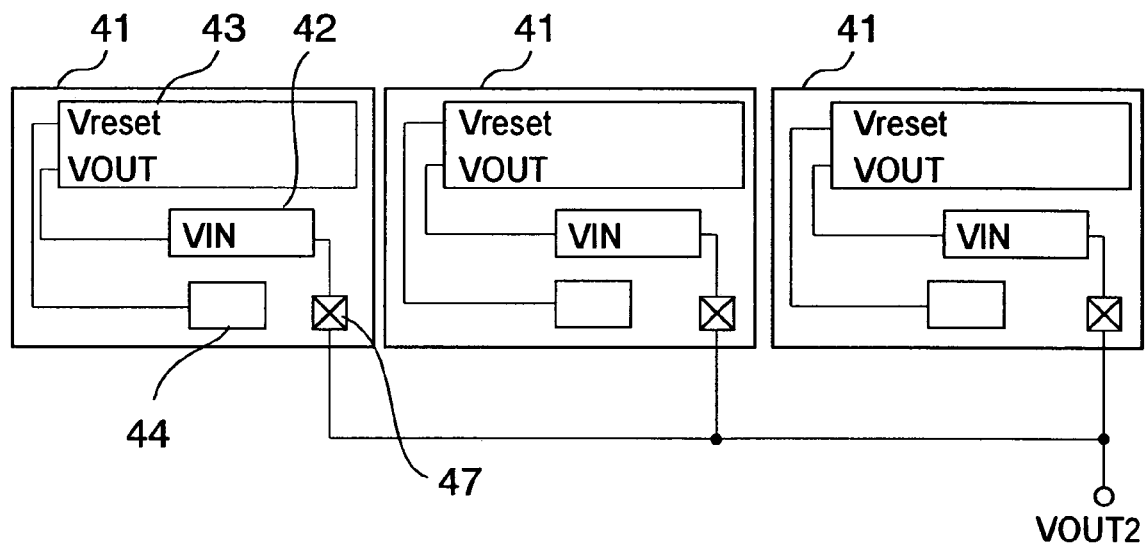
FIG. 4 is a schematic view of a close contact image sensor according to the embodiment of the present invention.

FIG. 4 is a schematic view of a close contact image sensor provided with the image sensors IC 41 of FIG. 3. This close contact image sensor is composed of the three image sensors IC 41. The signal output terminals 47 of all of the image sensors IC 41 are externally connected and outputted from a VOUT2 terminal to outside.

Figure 8:
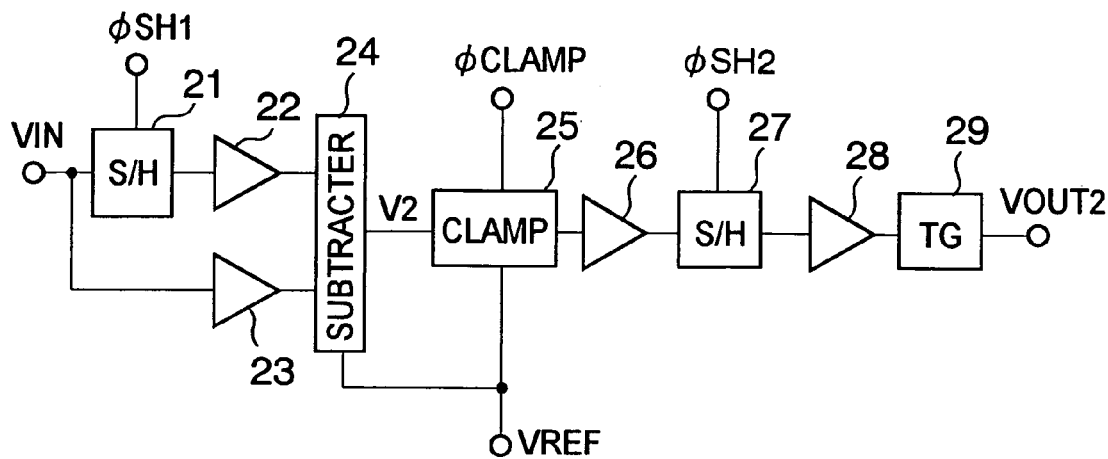
FIG. 8 is a block diagram of the signal processing circuit according to the embodiment of the present invention.

FIG. 8 is a block diagram of the signal processing circuit 42 in this embodiment of the present invention. The signal inputted to an input terminal VIN is inputted to a sample holding circuit 21 and a buffer amplifier 23. The output of the sample holding circuit 21 is inputted to a buffer amplifier 22. The output of the buffer amplifier 22 and the output of the buffer amplifier 23 are inputted to a subtracter 24, and the output of the subtracter 24 is inputted to a clamping circuit 25. Reference voltages of the subtracter 24 and the clamping circuit 25 can be made common and are connected to a VREF terminal. The output of the clamping circuit 25 is inputted to a buffer amplifier 26. By the way, the buffer amplifier 26 may be replaced by an amplifying circuit. Moreover, the reference voltage of this amplifying circuit may be common to the VREF terminal. The output of the buffer amplifier 26 is inputted to a sample holding circuit 27. The output of the sample holding circuit 27 is inputted to a buffer amplifier 28. The output of the buffer amplifier 28 is inputted to a transmission gate 29. The output of the transmission gate 29 is inputted to an output terminal VOUT2. By the way, the transmission gate 29 may be unnecessary depending on the usage field.

Figure 9:
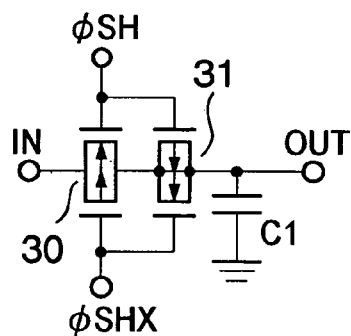
FIG. 9 is a circuit diagram of a sample holding circuit according to the embodiment of the present invention.

FIG. 9 is a circuit diagram of the sample holding circuit according to the embodiment of the present invention, and it can be used for the sample holding circuit 21 and the sample holding circuit 27. The sample holding circuit is composed of a transmission gate 30, a dummy switch 31 and a capacitor C1. In this sample holding circuit, in order to cancel out the noises of a ΦSH pulse and a ΦSHX pulse which is the inversion thereof, the sizes of the NMOS and PMOS transistors of the transmission gate 30 are set to be equal and the gate areas of the NMOS and PMOS transistors of the dummy switch 31 are set to be half the gate area of the transistor of the transmission gate.

Figure 10:
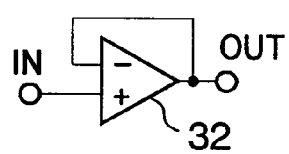
FIG. 10 is a circuit diagram of a buffer circuit according to the embodiment of the present invention.

FIG. 10 is a circuit diagram of the buffer amplifier according to the embodiment of the present invention, and it is constituted by an operating amplifier 32. This circuit can be used for the buffer amplifiers 22, 23, 26 and 28. By the way, the buffer amplifier may be a source follower amplifier.

Figure 11:
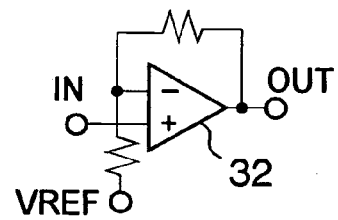
FIG. 11 is a circuit diagram of an amplifying circuit according to the embodiment of the present invention.

FIG. 11 is a circuit diagram of the amplifying circuit according to the embodiment of the present invention, and it is composed of the operating amplifier 32 and resistors. If this circuit is used instead of the buffer amplifier 26, the amplification factor of the signal processing circuit can be increased. Also, the reference voltage VREF of this amplifying circuit may be common to the VREF terminal in FIG. 1.

Figure 12:
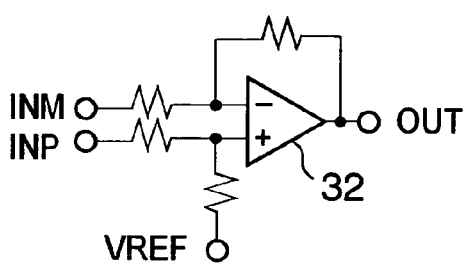
FIG. 12 is a circuit diagram of a subtracter according to the embodiment of the present invention.

FIG. 12 is a circuit diagram of the subtracter according to the embodiment of the present invention, and it is composed of the operating amplifier 32 and resistors. This circuit multiplies the voltage, in which the voltage INM is subtracted from the voltage INP, by the gain times determined from the ratio between the resistors, and then outputs it with the voltage of VREF as a reference. If the terminals inputted to the INP and the INM are made reverse, the output can be inverted with the voltage of VREF as the reference.

Figure 13:
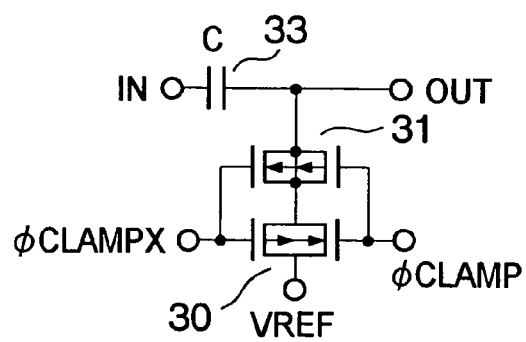
FIG. 13 is a circuit diagram of a clamping circuit according to the embodiment of the present invention.
Figure 14:
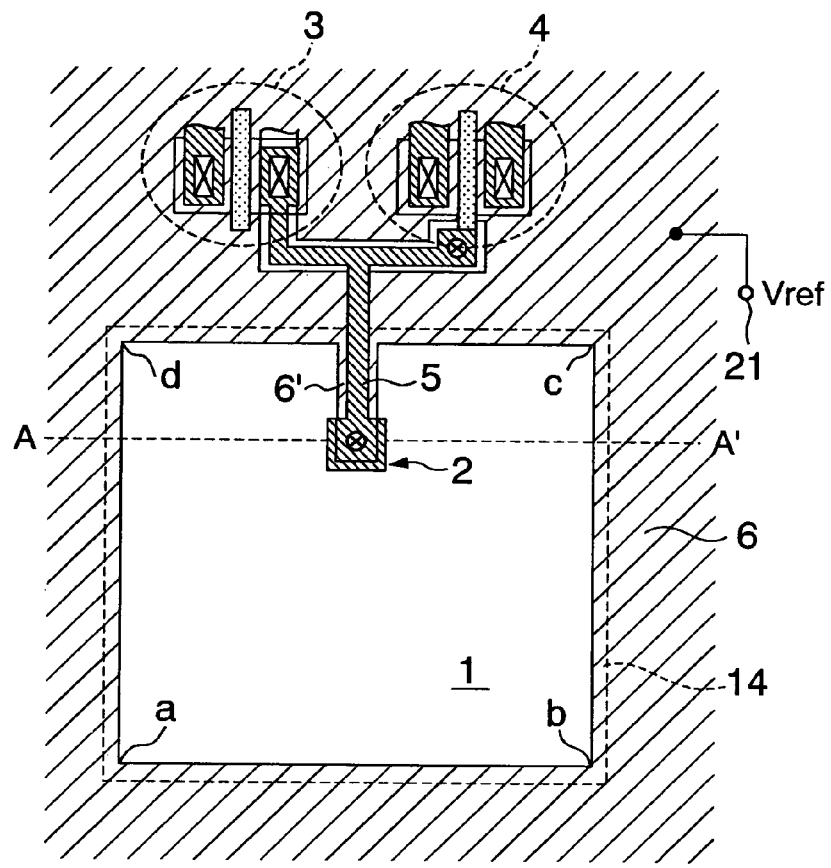
FIG. 14 is a plan view of a light receiving element of a conventional photoelectric converter.
Figure 15:
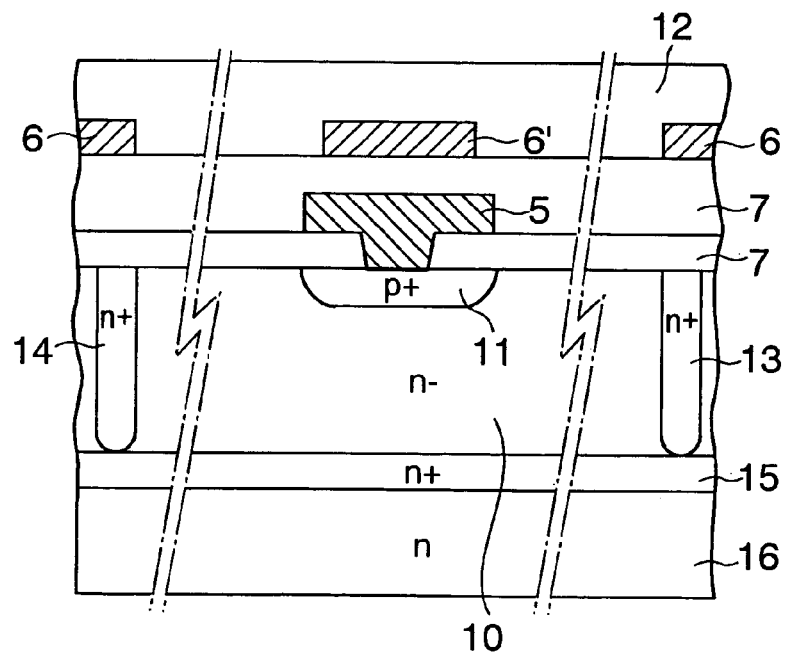
FIG. 15 is a sectional view taken along the line A–A' of FIG. 14.

FIG. 13 is a circuit diagram of the clamping circuit according to the embodiment of the present invention, and it can be used for the clamping circuit 25. The clamping circuit is composed of the transmission gate 30, the dummy switch 31 and a capacitor 33. In this clamping circuit, in order to cancel the noises of a ΦCLAMP pulse and a ΦCLAMPX pulse which is the inversion thereof, the sizes of the NMOS and PMOS transistors of the transmission gate 30 are set to be equal, and the gate areas of the NMOS and PMOS transistors of the dummy switch 31 are set to be half the gate area of the transistor of the transmission gate.

Figure 5:
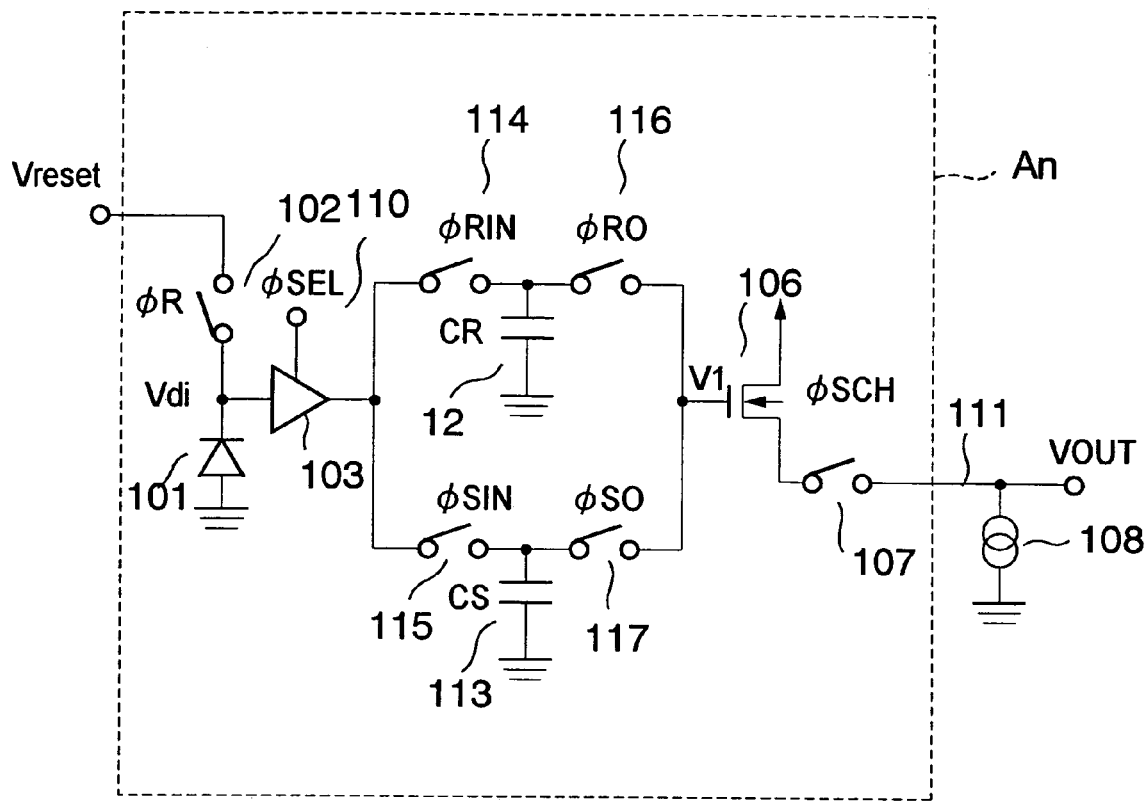
FIG. 5 is a schematic circuit diagram of the photoelectric converter according to the embodiment of the present invention.
Figure 7:
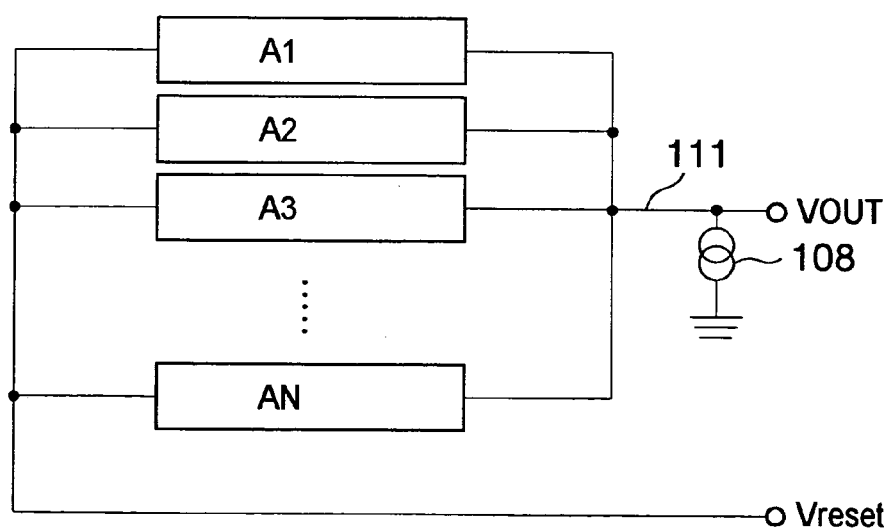
FIG. 7 is an entire configuration view of the photoelectric converter according to the embodiment of the present invention.

FIG. 5 is a schematic circuit diagram of the photoelectric converter 43 according to the embodiment of the present invention. The members within the frame of a photoelectric converting block An shown in FIG. 5 are installed correspondingly to the number of the pixels, and a channel selection switch 107 of each block is connected to a common signal line 111. Note that the photoelectric converting block An indicates the photoelectric converting block of an n-th bit. FIG. 7 shows the entire configuration view of the photoelectric converter 43.

This circuit is provided with: a photodiode 101 serving as a photoelectric converting unit; transferring switches serving as charge transferring units 114, 115, 116 and 117; a reset switch 102 serving as a reset unit; an amplifying unit 103; a capacitor 113 for holding an optical signal; a capacitor 112 for holding a reference signal serving as the reference of the photoelectric converting unit; a MOS transistor 106 for constituting a MOS source follower serving as a signal reading out unit; the channel selection switch 107 serving as a channel selecting unit; the common signal line 111; and a current source 108.

FIG. 1 shows the plan view indicating the photodiode 101, the reset switch 102, and a part of the amplifying unit 103 in FIG. 5. The diffusion region 52 in FIG. 1 corresponds to the photodiode 101 of FIG. 5, the circuit 58 corresponds to the reset switch 102, and the circuit 57 corresponds to the part of the amplifying unit 103, respectively.

One terminal of the reset switch 102 is connected to a Vreset terminal, and the Vreset terminals of all of the photoelectric converters 101 are common, as shown in FIG. 3. The amplifying unit 103 is composed of MOS source follower, voltage follower amplifiers and the like, and an amplifier enabling terminal 110 for selecting an operational state may be installed.

Figure 6:
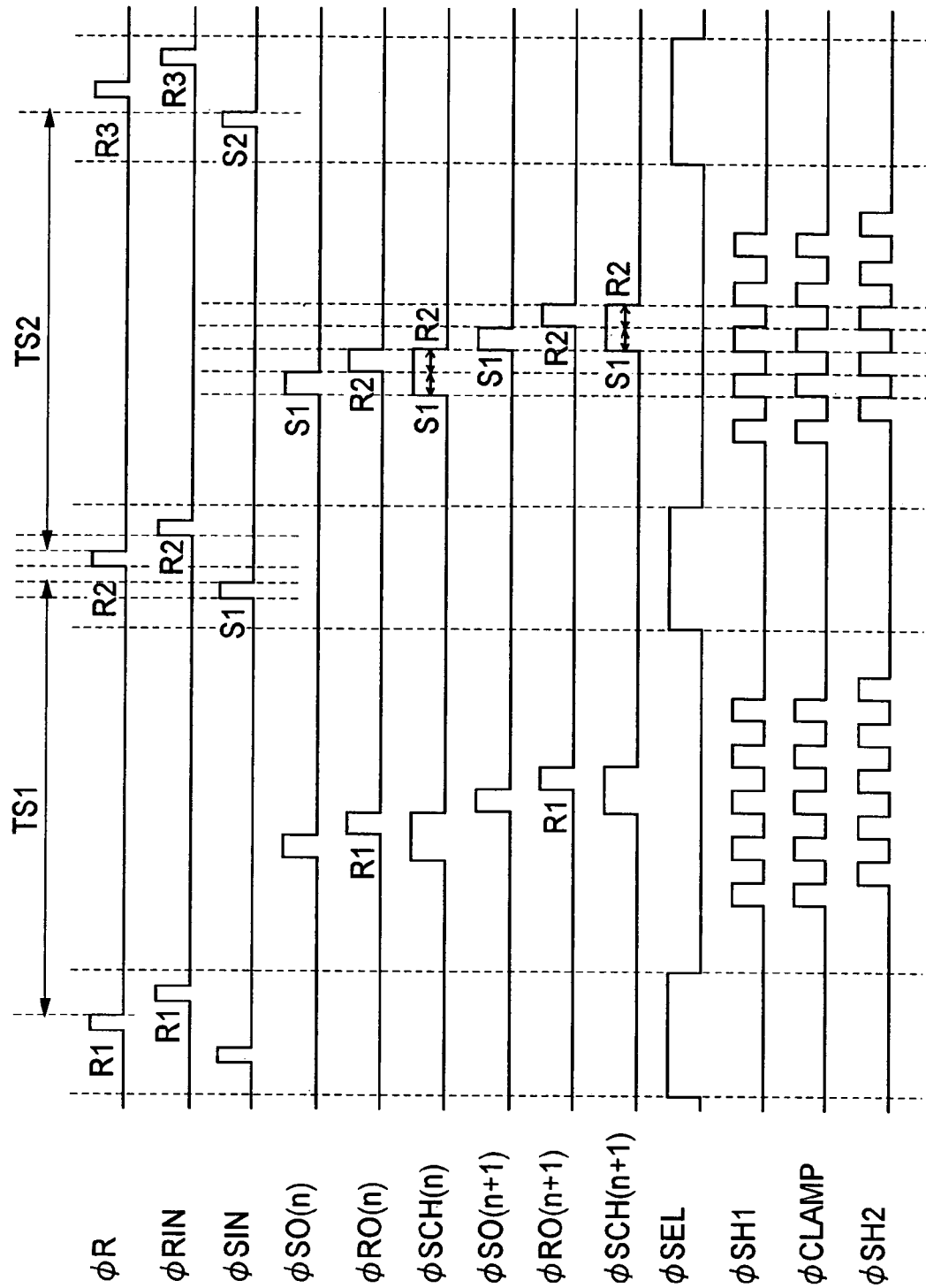
FIG. 6 is a timing chart of a signal processing circuit and the photoelectric converter according to the embodiment of the present invention.

The output terminal VOUT of this photoelectric converter is inputted to the input terminal VIN of the signal processing circuit 42. The photoelectric converter and the signal processing circuit can be formed on one semiconductor substrate. FIG. 6 is a timing chart of the photoelectric converter 43 and the signal processing circuit 42 according to the embodiment of the present invention. The operations of the photoelectric converter 43 will be described below with reference to this timing chart. Symbols ΦR, ΦRIN, ΦSIN and ΦSEL in FIG. 6 are simultaneously operated in all of the bits. Symbols ΦSO, ΦRO and ΦSCH are represented together with (n), because their operation timings are different depending on the bits.

At first, the operation of the photoelectric converting block of the n-th bit is explained. The optical signal obtained after the accumulation of the charges generated by the light entering the photodiode 1 by turning on the transferring switch 15 through the pulse at a position S1 of the ΦSIN is read out to a capacitor 13. Next, when a reset switch 2 is turned on through the pulse of a position R2 of the ΦR, an output terminal Vdi of the photodiode 1 is fixed to the reference voltage Vreset. Then, when the reset switch 2 is turned off, the voltage of Vdi has the value in which an off noise is added to the Vreset.

Next, immediately after the reset switch 2 is turned off, the transferring switch 14 is turned on through the pulse of a position R2 of the ΦRIN, and the reference voltage after the photodiode 1 is reset is read out to a capacitance 12. After that, the optical charges are accumulated in the photodiode 1, and the potential Vdi is varied correspondingly to the amount of the optical charges. This accumulation period is the period from the end of the period R2 of the ΦR to the end of the period S2 of the ΦSIN of a next cycle. Thus, the accumulation period becomes the period TS2 of FIG. 6, and it is the same period with regard to all of the bits. If the photodiode receives the radiation noise from the outside in this period, the potential of the photodiode is varied. However, due to the structure of the present invention, the radiation noise is shielded, which makes the variation in the potential of the photodiode caused by the radiation noise small.

The operations for reading out the reference signal and the optical signal will be described below. In the accumulation period TS2 of FIG. 6, when a channel selection switch 7 is opened through the pulse ΦSCH(n) and the transferring switch 17 is simultaneously opened through the pulse ΦSO (n), the optical signal held in the capacitor 13 is read out to the common signal line 11. This period is the portion S1 of the ΦSCH (n). This optical signal is the signal accumulated in the period TS1, and the reset voltage reset through the pulse of a position R1 of the ΦR is defined as the reference.

Next, when the transferring switch 16 is opened through the pulse of the ΦRO(n), the reference signal held in the capacitor 12 is read out to the common signal line 11. This reference signal is the signal reset by the pulse of the position R2 of the ΦR. When the signal processing circuit at a later stage extracts the difference between the optical signal and the reference signal, the voltage difference resulting from the light can be extracted.

Next, after the ΦSCH(n) is turned off, when the channel selection switch 7 of a next bit is turned on through the ΦSCH(n+1) and the transferring switch 17 of the next bit is opened through the pulse of the ΦSO (n+1), the operation for reading out the optical signal of the next bit is started. The other pulses of the (n+1)-th bit are all delayed by the on period of the ΦSCH from the pulse of the n-th bit.

As mentioned above, outputted from the VOUT terminal are the optical signal of the n-th bit, the reference signal of the n-th bit, the optical signal of the (n+1)-th bit and the reference signal of the (n+1)-th bit in the stated order. Hereinafter, for the convenience, the output period of the optical signal is referred to as a former period, and the output period of the reference signal is referred to as a later period.

The operation of the signal processing circuit 42 will be described below. The output of the above-mentioned OUT terminal is inputted to the VIN terminal. A sample holding pulse ΦSH1 is turned on after the optical signal begins to be outputted, and it is turned off before the optical signal is ended. Consequently, the optical signal is sample-held. The signal of the VIN and the signal after being sample-held are inputted to the subtracter. In the former period, the same optical signal is inputted to the subtracter. In the later period, the sample-held optical signal and the reference signal are inputted to the subtracter. Thus, the output of the subtracter becomes at a VREF level in the former period, and it becomes at the level in which the VREF level is added to the level where the difference between the optical signal and the reference signal is multiplied by the gain times, in the later period. Also, the offsets of the buffer amplifiers 22 and 23 and the subtracter 24 are overlapped with the output in the former period, and the offsets of the buffer amplifiers 22 and 23 and the subtracter 24 and the offset of the sample holding circuit 21 are overlapped with the output in the later period.

A clank pulse ΦCLAMP is added such that it is turned on before the ΦSH1 is turned on and it is turned off before the ΦSH1 is turned off. Consequently, the output of the clanking circuit 25 is clamped to the VREF level in the former period, and it becomes at the level in which the VREF level is added to the level where the former output is subtracted from the later output of the subtracter, in the later period. As a result, the offsets of the buffer amplifiers 22 and 23 and the subtracter 24 are not overlapped with the output in the later period of the clamping circuit. Also, the offset of the sample holding circuit 21 is small because the noises of the ΦSH pulse and the ΦSHX pulse that is the inversion thereof are cancelled out in the circuit. From the above-mentioned description, the output in the later period of the clamping circuit becomes at the level to which the level where the difference between the optical signal and the reference signal is multiplied by the gain times is added, with the VREF level as the reference.

A sample holding pulse ΦSH2 is turned on before and after the reference signal begins to be outputted, and it is turned off before the reference signal is ended. Consequently, the output in the later period of the output after being clamped is sampled, and then held in the former period of a next bit. Thus, the output level can be maintained for a long period.

In this embodiment, while the photodiode is carrying out the accumulation operation in the period TS2, it is possible to read out the optical signal accumulated in the period of the previous accumulation period TS1. Thus, it is possible to read in the color image data by switching on the LEDs of three colors of RGB in turn. For example, it is possible to read in the red component by switching on the red LED in the period TS1, read in the green component by switching on the green LED in the period TS2, and read in the blue component by switching on the blue LED in the next period of the TS2. In this case, the red optical signal is read out within the period TS2.

In the explanation of the image sensor in the present invention as mentioned above, the signal processing circuit 42 need not be built in the IC.

Although the above-mentioned explanations have been mainly performed with regard to the linear image sensor IC, the configurations of FIGS. 1 and 3 can be also applied to an area image sensor IC.

In the above-mentioned explanations, the present invention is not limited to the above-mentioned respective embodiments, and it can be variously modified and executed without departing from the spirit and scope of the invention.

The present invention can be used for a linear image sensor IC applied to an image reading apparatus, such as a facsimile and an image scanner, and a close contact image sensor IC in which a plurality of image sensors IC are mounted. Also, the present invention can be applied to an area image sensor IC.

What is claimed is:

1. A photoelectric converter comprising:
   a first semiconductor region having a first conductivity type;
   a pixel region for accumulating generated carriers;
   a second semiconductor region having a second conductivity type disposed within the first semiconductor region and inside the pixel region;
   an electrode region having the second conductivity type disposed on the second semiconductor region;
   an oxide film disposed around the electrode region;
   a first aluminum wiring contacting the electrode region via a contact hole disposed in an intermediate insulating film for transforming a signal according to a quantity of the generated carriers accumulated in the pixel region;
   a second aluminum wiring encircling an outer periphery of the pixel region and held at a predetermined constant potential; and
   a transparent conductive film disposed on the oxide film and inside the second semiconductor region and contacting the second aluminum wiring.

2. A photoelectric converter according to claim 1; wherein the transparent conductive film comprises a poly-silicon film.

3. An image sensor integrated circuit having the photoelectric converter according to claim 1.

4. An image sensor integrated circuit according to claim 3; wherein the image sensor integrated circuit comprises a linear image sensor integrated circuit.

5. An image reading apparatus having the linear image sensor integrated circuit according to claim 4.

6. An image sensor integrated circuit according to claim 3; wherein the image sensor integrated circuit comprises a close contact image sensor integrated circuit.

7. An image sensor integrated circuit according to claim 3; wherein the image sensor integrated circuit comprises an area image sensor integrated circuit.

8. A photoelectric converter comprising:
   a first semiconductor region having a first conductivity type;
   a pixel region for accumulating generated carriers;
   a second semiconductor region having a second conductivity type disposed within the first semiconductor region and inside the pixel region;
   an electrode region having the second conductivity type disposed on the second semiconductor region;
   an oxide film disposed around the electrode region;
   a first aluminum wiring contacting the electrode region via a contact hole disposed in an intermediate insulating film for transforming a signal according to a quantity of the generated carriers accumulated in the pixel region;
   a second aluminum wiring encircling an outer periphery of the pixel region and held at a predetermined constant potential; and
   a conductive film connecting the first aluminum wiring with a circuit element arranged outside of the pixel region, the conductive film being disposed on the oxide film and partly under the second aluminum wiring.

9. A photoelectric converter according to claim 8; wherein the conductive film comprises a polysilicon film.

10. An image sensor integrated circuit having the photoelectric converter according to claim 8.

11. An image sensor integrated circuit according to claim 10; wherein the image sensor integrated circuit comprises a linear image sensor integrated circuit.

12. An image reading apparatus having the linear image sensor integrated circuit according to claim 11.

13. An image sensor integrated circuit according to claim 10; wherein the image sensor integrated circuit comprises a close contact image sensor integrated circuit.

14. An image sensor integrated circuit according to claim 10; wherein the image sensor integrated circuit comprises an area image sensor integrated circuit.

15. A photoelectric converter comprising:
- a first semiconductor region having a first conductivity type;
- a pixel region for accumulating generated carriers;
- a second semiconductor region having a second conductivity type disposed within the first semiconductor region and inside the pixel region;
- an electrode region having the second conductivity type disposed on the second semiconductor region;
- an insulating film disposed around the electrode region;
- a first conductor wiring disposed in contact with the electrode region for transforming a signal according to a quantity of the generated carriers accumulated in the pixel region;
- a second conductor wiring disposed around the pixel region and held at a predetermined constant potential; and
- a conductive film disposed on the insulating film and inside of the second semiconductor region and in contact with the second conductor wiring.

16. An image sensor integrated circuit having the photoelectric converter according to claim 15.

17. An image sensor integrated circuit according to claim 16; wherein the image sensor integrated circuit comprises a linear image sensor integrated circuit.

18. An image reading apparatus having the linear image sensor integrated circuit according to claim 17.

* * * * *

UNITED STATES PATENT AND TRADEMARK OFFICE
CERTIFICATE OF CORRECTION

PATENT NO. : 7,161,196 B2
APPLICATION NO. : 10/939053
DATED : January 9, 2007
INVENTOR(S) : Satoshi Machida Page 1 of 1

It is certified that error appears in the above-identified patent and that said Letters Patent is hereby corrected as shown below:

On the Title Page, Item [30] should read:

--[30]   Foreign Application Priority Data

Sep. 12, 2003   (JP)........................2003-322002--

Signed and Sealed this
Eighteenth Day of June, 2013

Teresa Stanek Rea
*Acting Director of the United States Patent and Trademark Office*